United States Patent [19]

Suzuki

[11] Patent Number: 4,947,109

[45] Date of Patent: Aug. 7, 1990

[54] DETECTOR OF QUANTITY OF ELECTRICITY

[75] Inventor: Sunao Suzuki, Kobe, Japan

[73] Assignee: Mitsubishi Denki Kabushiki Kaisha, Tokyo, Japan

[21] Appl. No.: 428,950

[22] Filed: Oct. 30, 1989

[30] Foreign Application Priority Data

Oct. 31, 1988 [JP] Japan ................. 63-276807

[51] Int. Cl.$^5$ .................. G01R 15/10; G01R 21/06; H02H 3/253
[52] U.S. Cl. ................. 324/132; 324/142; 324/483; 324/492; 361/86
[58] Field of Search .............. 324/132, 142, 119, 418, 324/110; 364/483, 492; 361/78, 79, 80, 86, 93, 94

[56] References Cited

U.S. PATENT DOCUMENTS

| | | | |
|---|---|---|---|
| 4,689,570 | 8/1987 | Ohgaki et al. | 324/418 |
| 4,709,295 | 11/1987 | Yamaura et al. | 364/492 |
| 4,774,621 | 9/1988 | Andow | 364/483 |
| 4,885,656 | 12/1989 | Suzuki et al. | 361/86 |

FOREIGN PATENT DOCUMENTS 62-333434 12/1987 Japan .

*Primary Examiner*—Ernest F. Karlsen
*Attorney, Agent, or Firm*—Bernard, Rothwell & Brown

[57] ABSTRACT

A detector of quantity of electricity of the invention for detecting an amplitude value from the quantity of AC electricity, comprising sampling means for sampling the quantity of AC electricity at a cycle T which is ¼ of the rated cycle of quantity of AC electricity, and operating means for operating the amplitude value on the basis of the sampling values, operates with the following formula:

$$y(o)^2 + 3 \cdot \{y(T)^2 + y(2T)^2\} + y(3T)^2$$

where, y(t−nT) is expressed as y(nT).

7 Claims, 4 Drawing Sheets

DETECTOR OF QUANTITY OF ELECTRICITY

BACKGROUND OF THE INVENTION

1. Field of the Invention

This invention relates to a detector of quantity of electricity for detecting a value of amplitude of quantity of electricity of AC voltage, AC current and the like, particularly to improvement of frequency characteristics thereof.

2. Description of Related Art

FIG. 1 is a figure explaining a principle of a conventional digital processing apparatus of a quantity of AC electricity disclosed in Japanese Patent Application No. 62-333434, the value of amplitude being determined by using three data which have been sampled with electrical angle 90° of AC current being sampling cycle T. In the figure, assuming that a sampling value 1 of an appropriate time is i(O), a sampling value 2 preceding one cycle (T) being i(T), a sampling value 3 preceding two cycles (2T) being i(2T), sampling values 1~3 are squared, by square operating means 5~7 respectively, and only the result of the square operating means 6 is doubled by a double operating means 29.

The results obtained at aforesaid square operating means 5 and 7 are added to the result of aforesaid double operating means 29 by an adder means 11 so as to obtain the sum. The sum is divided by 2 by a divide operating means 30 and the square root is calculated by a square root operating means 13 to obtain, at a terminal 14, the output Fn thereof, being the value of amplitude of AC current.

Next, explanation will be given on the operation. For the convenience sake of the explanation, the quantity of AC electricity is assumed to be AC current, maximum value I, instantaneous magnitude i, fundamental blade frequency fo, and the sampling cycle T whose cycle is made to be ¼ of the fundamental blade frequency fo. And in order to distinguish data at a sampling time, assuming that nT (where n =0, 1, 2, ..., and n=0 being this time) is suffix, the sampling value of the appropriate time are expressed to be i(O), the sampling value preceding one cycle from the appropriate time to be i(T), and the sampling value preceding two cycles from the appropriate time to be i(2T)... respectively.

When output Fn is expressed in any formula, the following first formula is obtained.

$$\begin{aligned} Fn &= [\tfrac{1}{2}\{i^2(O) + 2i^2(T) + i^2(2T)\}]^{\tfrac{1}{2}} \\ &= [\tfrac{1}{2}I^2\{\sin^2(\theta) + 2\sin^2(\theta - T) + \sin^2(\theta - 2T)\}]^{\tfrac{1}{2}} \\ &= I[1 - \tfrac{1}{2}\{1 + \cos(2T)\} \cdot \cos(2\theta - 2T)]^{\tfrac{1}{2}} \\ &= I[1 - \cos^2(T) \cdot \cos(2\theta - 2T)]^{\tfrac{1}{2}} \end{aligned} \quad (1)$$

The sampling cycle T is fixed to ¼ cycle relative to where the fundamental frequency of the AC current, that is, a time period which corresponds to electrical angle 90°, however, where the frequency of the sampling time is f, the sampling cycle T is expressed as in the second formula.

$$T = \frac{f}{fo \times 4} \times 360° \quad (2)$$

For example, the frequency of the AC current is f=fo =50 Hz, the sampling cycle T=90° is established.

Generally, as an electric power system is operated by rated frequency fo, in formula (1), Fn=I is obtained, thereby the amplitude value of the current can be calculated, which, for example, is used for such as an AC excess current protection relay and a control apparatus. But, for the protection relay for detecting accidents being happened in the electric power system and for the control apparatus for detecting the quantity of electricity for controlling an operation apparatus, there are many cases where the frequency of the electric power system has changed from fo. But, even if there is some dislocation of frequency of the electric power system, there is a need to determine the value of amplitude accurately. Generally, in order to cope with the change of ±5% of the frequency, it is necessary to lessen errors as much as possible.

Now, assuming that the frequency f=52.5 Hz (increase of 5% of 50 Hz), formula T=94.5° is obtained. When it is substituted in formula (1), the following formula is established:

$$Fn = I\{1 - 0.0062\cos(2\theta - 189°)\}^{\tfrac{1}{2}} \quad (3).$$

Such result is obtained as that the constant value is degenerated by the amplitude waveform of double cycle. Since $\cos(2\theta - 189°)$ can be changed from +1.0 to −1.0, the formula (3) becomes as $$Fn = 0.997I \sim 1.003I \quad (4),$$

thereby, the error of −0.3% to 0.3% is created compared with that of the operation of the amplitude value at the time when the rated frequency is 50 Hz.

Because the conventional detector of quantity of electricity is so constructed as above, there is a problem that the calculation of error of amplitude value is relatively larger in the case where the frequency varies to the extent of about ±5%.

SUMMARY OF THE INVENTION

The present invention has been devised to solve such a problem as mentioned above.

The primary object of the invention is to provide a detector of quantity of electricity which is capable of lessen the detected error of the amplitude value of quantity of AC electricity on the basis of four sampling values of quality of AC electricity.

The above and further objects and features of the invention will more fully be apparent from the following detailed description with accompanying drawings.

DESCRIPTION OF THE PREFERRED EMBODIMENTS

Figure 1:
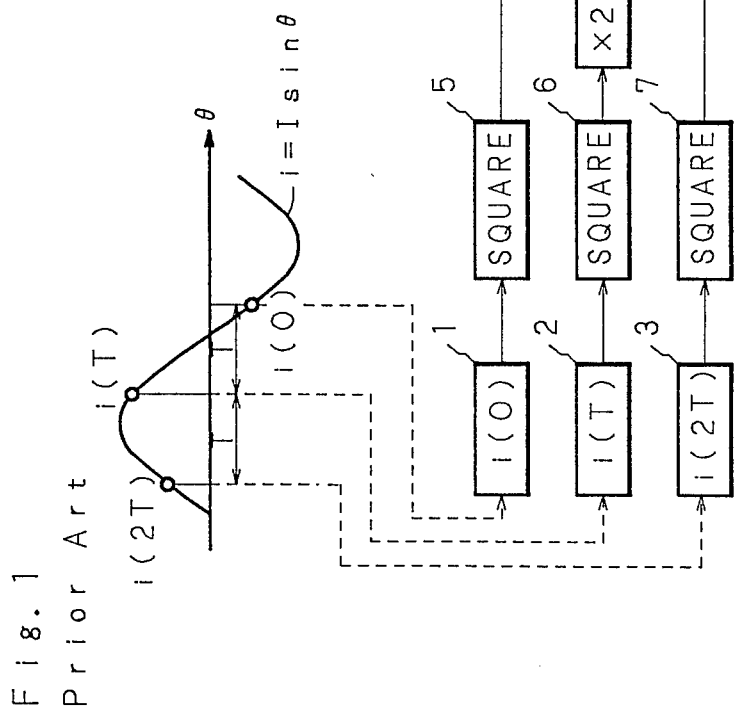
FIG. 1 is a drawing showing a conception of detecting principle of the conventional detector of quantity of electricity.

An explanation will now be given on an embodiment of the present invention referring to the drawings.

Figure 2:
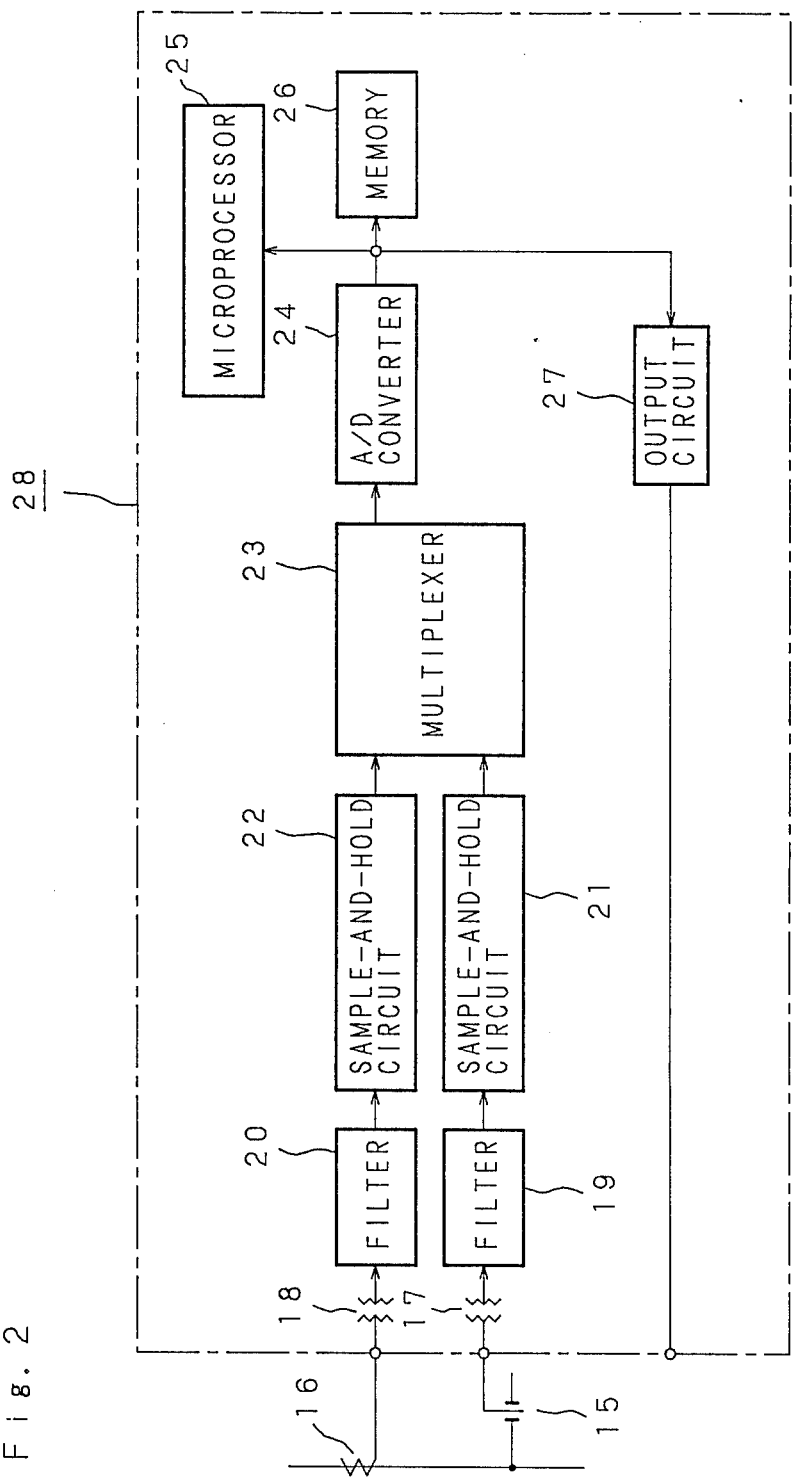
FIG. 2 is a block diagram showing a construction of the detector of quantity of electricity.

FIG. 2 is a block diagram showing a hardware construction of the detector of quantity of electricity 28 for executing aforesaid calculation of amplication value. In the figure, reference numeral 15 is a potential transformer, 16 being a current transformer, 17 and 18 being input transformers for converting the values of voltage and current of the electric power system so that they can be processed easily, and reference numerals 19 and 20 being filters for removing frequency at more than a half of the sampling frequency out of such high frequency as included in the voltage and current, as well known. Numerals 21 and 22 are sample-and-hold circuits for holding the sampling value until the next sampling cycle. Numeral 23 is a multiplexer for sequentially switching the outputs of the sample-and-hold circuits so as to transmit them to an analog-digital converter 24. Numeral 25 is a microprocessor for executing calculation by using the program being previously stored in a memory 26, the result thereof being outputted to an output circuit 27.

Figure 3:
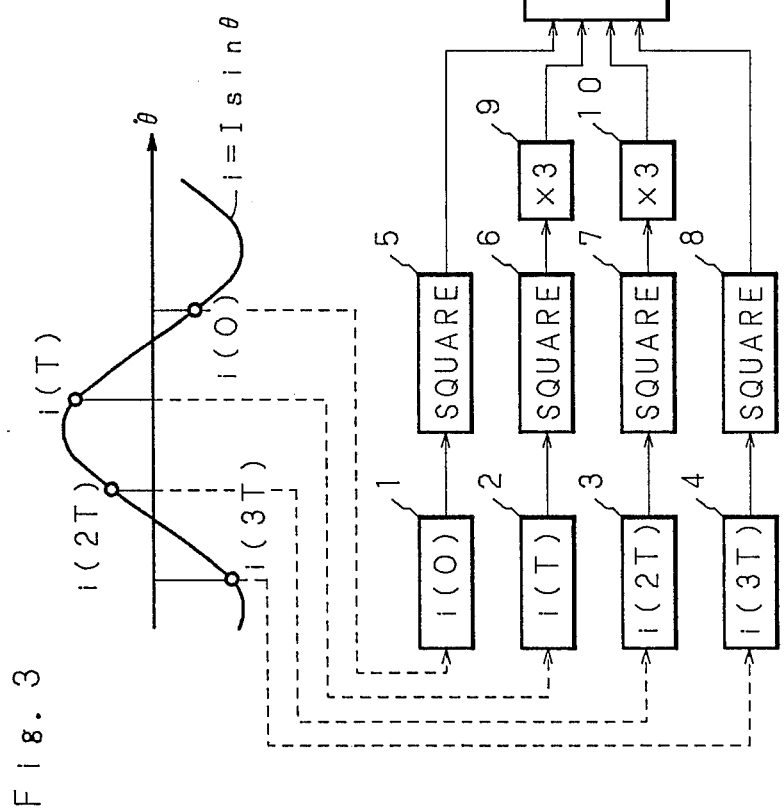
FIG. 3 is a drawing showing a conception of detecting principle of the detector of quantity of electricity of the present invention.

FIG. 3 is a conceptual diagram showing a principle of detecting the quantity of electricity by the detector of quantity of electricity 28. The sampling values $1 \sim 4$, at the time $t-nt$ ($n=0, 1, 2, 3$) which is separated cycles being required for obtaining the predetermined sampling number n according to the time t, are assumed to be $i(0)$, $i(T)$, $i(2T)$, and $i(3T)$, and the sampling values $1 \sim 4$ are squared by the square calculating means $5 \sim 8$, respectively, only the result of the square calculating means 6 and 7 being tripled by triple calculating means 9 and 10.

The result being obtained by aforesaid square calculating means 5 and 8, are added to the result of aforesaid triple calculating means 9 and 10 by the adding means 11 so as to obtain the sum. Then the sum is divided by 4 by a division calculating means 12 so as to obtain the square root by a square root calculating means 13. The result is obtained to be as the output Fn at a terminal 14.

The above operation is expressed in such formula (5) as follows:

$$\begin{aligned} Fn &= [\tfrac{1}{4}[i(0)^2 + 3\{i(T)^2 + i(2T)^2\} + i(3T)^2]]^{\tfrac{1}{2}} \\ &= [\tfrac{1}{4}I^2[\sin^2(\theta) + 3\{\sin^2(\theta - T) + \sin^2(\theta - 2T)\} + \\ &\quad \sin^2(\theta - 3T)]]^{\tfrac{1}{2}} \\ &= [\tfrac{1}{8}I^2[1 - \cos 2\theta + 3\{1 - \cos 2(\theta - T) + 1 - \\ &\quad \cos 2(\theta - 2T)\} + 1 - \cos 2(\theta - 3T)]]^{\tfrac{1}{2}} \\ &= [\tfrac{1}{8}I^2[8 - \{\cos 2\theta + \cos 2(\theta - 3T)\} - 3\{\cos 2(\theta - T) + \\ &\quad \cos 2(\theta - 2T)\}]]^{\tfrac{1}{2}} \\ &= [\tfrac{1}{8}I^2[8 - 2\cos(3T)\cos(2\theta - 3T) - \\ &\quad 6\cos(T)\cos(2\theta - 3T)]]^{\tfrac{1}{2}} \\ &= [\tfrac{1}{8}I^2[8 - \{8\cos^3(T) - 6\cos(T)\}\cos(2\theta - 3T) - \\ &\quad 6\cos(T)\cos(2\theta - 3T)]]^{\tfrac{1}{2}} \\ &= [I^2[1 - \cos^3(T)\cos(2\theta - 3T)]]^{\tfrac{1}{2}} \\ &= I[1 - \cos^3(T)\cos(2\theta - 3t)]^{\tfrac{1}{2}} \end{aligned}$$ (5)

At the sampling time, in the case where the frequency f=52.5 Hz (increase of 5% of 50 Hz), such formula as T=94.5° is obtained. When this is substituted into the formula (5), the following formula (6) is obtained:

$$Fn = I[1-\cos^3(94.5°)\cdot\cos(2\theta-3\times 94.5°)]^{\tfrac{1}{2}} = I[1+4.83\times 10^{-4}\cos(2\theta-283.5°)]^{\tfrac{1}{2}} \quad (6)$$

This formula expresses that the amplitude relative to I is to be as $4.83 \times 10^{-4}$ and the amplitude wave form of double frequency is degenerated. Since $\cos(2\theta - 283.5°)$ can be changed from $+1.0$ to $-1.0$, the following formula is established:

$$Fn = 0.99976 I \sim 1.00024 I \quad (7)$$

When this is compared with the calculation of amplitude value at 50 Hz of the rated frequency, the error is to be such minimum value as $-0.024\%$ to $+0.024\%$.

The result of calculation of the amplitude value Fn obtained here (not shown) is compared with the predetermined value (also called setting value) by a comparison calculating means so as to compare which is larger, thereby detecting accidents to the electric power system by the digital protection relay. And according to the obtained Fn, the control apparatus (not shown) is used for such as on-off control of a static capacitor and the like.

In addition, the above explanation has made on such arrangement as that the output of the adding means 11 is processed by the division calculating means 12 and the square root calculating means 13, however, aforesaid square calculating means 13 is dispensable, if the preset values of the digital protection relay and the control apparatus are set at the values which have been obtained by squaring the predetermined value (setting value). And, if the preset value is set at the value which has been obtained by squaring the predetermined value (setting value) and then quadrupling, aforesaid division calculating means 12 and aforesaid square root calculating means 13 become dispensable.

In addition, in aforesaid embodiment, the outputs of the square calculating means 6 and 7 are adapted to be tripled by triple calculating means 9 and 10 respectively, however, such change of the well-known operation law as to calculate the sum of the square calculating means 6 and 7 and then triple the sum, is not restricted in any way.

Next will be explained the change status of Fn being the result of calculation of the amplitude value in the case where the frequency is varied.

When the ratio of the frequency f after the change to the rated frequency fo is expressed as the formula m=f/fo, formula (8) is obtained from formulas (2) and (5).

$$Fn = I[1-\cos^3(T)\cdot\cos(2\theta-3T)]^{\tfrac{1}{2}} = I[1-\cos^3(90° m)\cdot\cos(2\theta-3\times 90° m)]^{\tfrac{1}{2}} \quad (8)$$

Figure 4:
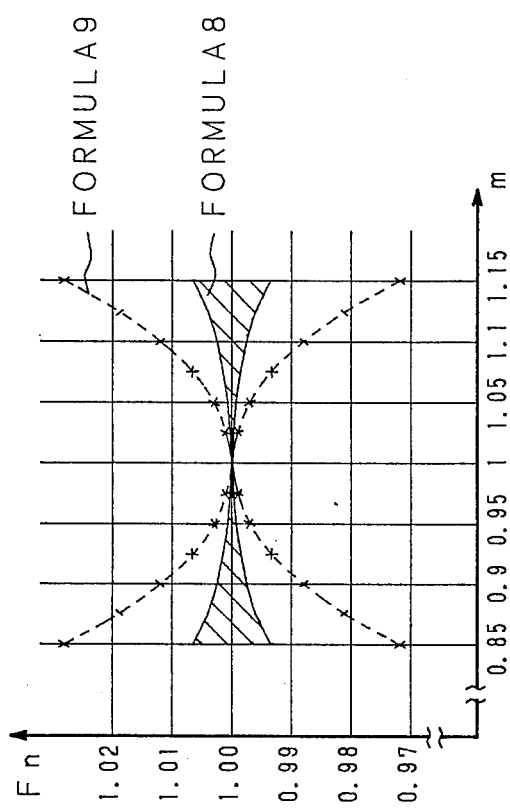
FIG. 4 is a graph which compares the detected accuracy of the conventional detector of quantity of electricity with the one that of the present invention.

When m in the formula (8) is varied and displayed, which is shown in the portion of oblique lines in FIG. 4, and in the vicinity of m=1 (f=fo), the change of the size of the portion is scarcely to be seen, thereby it can be clear that the error of the calculated result of the amplitude value becomes minimum.

In the same way, formula (9) is obtained by expressing the conventional formula (1) with such formula of m as described above, and dotted lines in FIG. 4 show that the calculation processing of the present invention obviously has less error.

$$Fn = I[1-\cos^2(90° m)\cdot\cos(2\theta-2\times 90° m)]^{\tfrac{1}{2}} \quad (9)$$

In addition, since the sampling value used in the calculation of amplitude value is realized with four sampling values including that at the predetermined time, the result can be obtained with the time period corresponding to 90°×4=360°, thereby the present invention can realize to obtain the result at a high speed practically the same as that in the conventional apparatus, and also generally the same quantity of memory necessary for calculation processing can be realized.

Furthermore, explanation has been given on the embodiment above mentioned in order to calculate the amplitude value of the AC current. The AC current at that time is the same as a phase current and a line-to-line current of the electric power system, or a symmetrical component obtained from aforesaid phase current and line-to-line current, that is, a positive phase current, a negative current or a zero phase current.

Moreover, the AC voltage can also has the same effect by applying it in the same way.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A detector of quantity of electricity comprising:
    sampling means for sampling quantity of AC (alternating current) electricity at a cycle T which is ¼ of the rated cycle of said quantity of AC electricity;
    analog-digital converting means for converting the analog values of said quantity of AC electricity which have been sampled; and
    operating means for operating the amplitude value Y of said quantity of AC electricity by using the following formula:

$$Y=[\tfrac{1}{4}\cdot[y(0)^2+3\cdot\{y(T)^2+y(2T)^2\}+y(3T)^2]]^{\tfrac{1}{2}}$$

where, y(t−nT) is expressed as y(nT), on the basis of four sampling values y's of said quantity of AC electricity at the time which precedes nT (n=0, 1, 2, 3) from the predetermined sampling time t.

2. A detector of quantity of electricity as set forth in claim 1 wherein said quantity of AC electricity is an alternating current.

3. A detector of quantity of electricity as set forth in claim 2 wherein said alternating current is a phase current.

4. A detector of quantity of electricity as set forth in claim 2 wherein said alternating current is a line-to-line current.

5. A detector of quantity of electricity as set forth in claim 1 wherein said quantity of AC electricity is that of alternating voltage.

6. A detector of quantity of electricity as set forth in claim 5 wherein said alternating voltage is a phase voltage.

7. A detector of quantity of electricity as set forth in claim 5 wherein said alternating voltage is a line-to-line voltage.

* * * * *